United States Patent
Confalonieri et al.

(10) Patent No.: US 6,940,348 B2
(45) Date of Patent: Sep. 6, 2005

(54) DIFFERENTIAL AMPLIFIER CIRCUIT WITH COMMON MODE OUTPUT VOLTAGE REGULATION

(75) Inventors: Pierangelo Confalonieri, Caponago (IT); Germano Nicollini, Piacenza (IT); Riccardo Martignone, Carnate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/471,807

(22) PCT Filed: Jul. 5, 2002

(86) PCT No.: PCT/EP02/07524
§ 371 (c)(1),
(2), (4) Date: Apr. 26, 2004

(87) PCT Pub. No.: WO03/012983
PCT Pub. Date: Feb. 13, 2003

(65) Prior Publication Data
US 2004/0169555 A1 Sep. 2, 2004

(30) Foreign Application Priority Data
Jul. 27, 2001 (IT) .................................. RM2001A0458

(51) Int. Cl.$^7$ .............................................. H03F 3/45
(52) U.S. Cl. ............................................. 330/69; 330/9
(58) Field of Search ............................. 330/9, 69, 258, 330/260; 341/143, 172; 327/124

(56) References Cited

U.S. PATENT DOCUMENTS

| 4,697,152 A | * | 9/1987 | Westwick ..................... 330/9 |
| 4,849,707 A | * | 7/1989 | Nicollini ..................... 330/9 |
| 5,805,019 A | * | 9/1998 | Shin ............................ 330/9 |
| 5,847,600 A | * | 12/1998 | Brooks et al. ................ 330/9 |
| 5,914,638 A | * | 6/1999 | He ............................. 330/258 |
| 5,973,536 A | * | 10/1999 | Maejima ..................... 327/337 |
| 6,169,427 B1 | * | 1/2001 | Brandt ........................ 327/94 |
| 6,411,166 B2 | * | 6/2002 | Baschirotto et al. ......... 330/258 |
| 6,661,283 B1 | * | 12/2003 | Lee ............................. 330/9 |
| 6,798,280 B2 | * | 9/2004 | Rossi .......................... 330/9 |
| 6,853,241 B2 | * | 2/2005 | Fujimoto ..................... 330/9 |

FOREIGN PATENT DOCUMENTS

EP 0 840 442 A1 5/1998

OTHER PUBLICATIONS

Castello, R. et al., "A High–Performance Micropower Switched–Capacitor Filter," *IEEE Journal of Solid–State Circuits* SC–20(6):1122–1132, Dec. 1985.

(Continued)

*Primary Examiner*—Michael Tokar
*Assistant Examiner*—Linh V. Nguyen
(74) *Attorney, Agent, or Firm*—Lisa K. Jorgenson; Robert Iannucci; Seed IP Law Group PLLC

(57) ABSTRACT

The circuit comprises a differential amplifier with two inputs and two outputs and a common mode regulation circuit. Between a regulation terminal of the amplifier and the outputs there are connected first and second capacitors and first and second capacitive elements that by controlled switches are connected in parallel with, respectively, the first and second capacitors or alternately between first and second reference voltage terminals. The common mode output voltage is not exactly fixed at the beginning of the design, but is determined by attributing appropriate values to the first and second capacitive elements; more particularly, their capacitances C3 and C4 are chosen in such a way as to satisfy the following equality:

Vcmn=Vrefl+[(Vrefp–Vrefm)/2]*(C4–C3)/(C3+C4), where Vcmn is the desired common mode output voltage, Vrefp and Vrefm are the differential output voltages and Vrefl is the voltage of the second reference terminal.

19 Claims, 3 Drawing Sheets

OTHER PUBLICATIONS

Recoules, H. et al., "A Comparative Study of Two SC–C-MFB Networks Used in Fully Differential OTA," in *Proceedings of the 1998 IEEE International Conference on Electronics, Circuits and Systems*, Lisboa, Portugal, Sep. 7–10, 1998, pp. 291–294.

Sarhang–Nejad, M. et al., "A High Resolution Multibit ΣΔ ADC with Digital Correction and Relaxed Amplifier Requirements," *IEEE Journal of Solid State Circuits* 28(6):648–660, Jun. 1993.

Senderowicz, D. et al., "A Family of Differential NMOS Analog Circuits for a PCM Codec Filter Chip," *IEEE Journal of Solid–State Circuits SC–17*(6):1014–1018, Dec. 1982.

Stevenson, J–M. et al., "A Highly Programmable Gain and Cutoff Frequency Multi–Channel Data Acquisition Chip," in *Proceedings of the 40th Midwest Symposium on Circuits and Systems*, Sacramento, CA, Aug. 3–6, 1997, pp. 320–323.

* cited by examiner

DIFFERENTIAL AMPLIFIER CIRCUIT WITH COMMON MODE OUTPUT VOLTAGE REGULATION

RELATED TO APPLICATION

This application is a 371 of PCT/EP 02/07524 filed on Jul. 5, 2002.

The present invention concerns switched capacitor circuits and, more particularly, a fully differential amplifier circuit with switched capacitors as defined in the preamble of claim 1.

As is well known, fully differential amplifiers are symmetrical circuit structures with two inputs and two outputs that are used in many circuit systems for processing analog and digital signals. They are used, for example, as operational amplifiers, comparators, impedance separator and adapter stages (buffers) and others. In operation the difference between their output voltages is proportional to the difference between the input voltages.

It is also known that if the output dynamics of the amplifier are to be optimized, the common mode output voltage, defined as the potential (with respect to a given reference potential) of the central point between the two output levels, must not differ very greatly from a constant value chosen by the designer. With a view to obtaining this result, recourse is usually had to a feedback regulation by means of a circuit that senses the common mode output voltage and acts on an operating parameter of the amplifier in such a way as to compensate any phenomena tending to displace the common mode output voltage from the chosen value.

The technique based on the use of switched capacitors in place of the traditional resistors is used in many integrated circuits on account of its advantages in terms of consumption, precision and space saving.

A known circuit employing a fully differential amplifier, a common mode feedback circuit and switched capacitors for performing the integrator function is described, for example, in an article entitled "A family of differential NMOS analog circuits for a PCM codec filter chip", IEEE JSSC, December 1982, Page 1014.

A circuit similar to the one described in the above article can be used as buffer for coupling a reference voltage generator, for example, of the single-ended output type with one or more circuit stages that need a differential reference voltage. A known buffer of this type, which is schematically represented in FIG. 1, uses various capacitors whose electrodes are selectively connected to various circuit nodes by means of two-way switches associated with the capacitors and controlled by a clock signal with two non-overlapping phases (generated by an appropriate circuit not shown in the figure). The positions of the switches shown in the figure correspond to one of the two phases of the clock signal; in the other of the two phases all the switches are in the other position. A fully differential gain amplifier Av, indicated by the reference number 10, has an inverting input, a non-inverting input and two differential outputs Vrefp, Vrefm. Two capacitors CSp, CSm, so-called sampling capacitors, have respective electrodes that can be selectively connected by means of respective switches SW1, SW2 to the inverting input and the non-inverting input of the amplifier 10 or to a terminal of a biasing voltage generator indicated by Vcmi (common mode input voltage). The other electrode of each of the two sampling capacitors can be selectively connected by means of respective switches SW3, SW4 to the single-ended output of a generator of a reference voltage Vref referred to ground or to a common reference terminal of the integrated circuit, here indicated by the ground symbol. It should be noted that when the capacitor CSp is connected to the terminal Vref, the capacitor CSm is connected to ground, and vice versa. A capacitor CIp, the so-called integration capacitor, is connected between the inverting input and the output Vrefp of the amplifier 10; another capacitor CDp, the so-called dumping capacitor, can be connected in parallel with the capacitor CIp by means of switches SW5 and SW6. The switches SW5 and SW6 selectively connect the dumping capacitor CDp either in parallel with the integration capacitor CIp or between the reference voltage terminals Vcmi and Vref. All integration capacitor CIm of the same capacity as the capacitor CIp is connected between the non-inverting input and the output Vrefm of the amplifier 10, while a dumping capacitor CDm of the same capacitance as the capacitor CDp can be selectively connected by means of switches SW7 and SW8 either in parallel with the capacitor CIm or between the biasing voltage terminal Vcmi and the reference voltage terminal Vref.

The amplifier 10 has a common mode regulation terminal INCM that makes it possible to influence the functioning of the amplifier in such a way as to cause the potentials of the differential output terminals Vrefp and Vrefm to vary in the same direction and therefore to displace the common mode voltage with respect to ground potential. Two capacitors $C1p$ and $C1m$, which are of equal capacitance, are connected between the regulation terminal INCM and, respectively, the two amplifier outputs and can be respectively connected to one of two other capacitors $C2p$ and $C2m$ by means of switches SW9 and SW10, SW11 and SW12. These switches can selectively connect the capacitors $C2p$ and $C2m$ also between a biasing terminal VB and a reference terminal Vref1. The latter terminal is connected to the output of a level converter circuit 20 that has its input connected to one terminal of a reference voltage generator, in this example to the reference voltage terminal Vref.

As will be clear to a person skilled in the art, when the switches SW1–SW12 are operated in sequence by the clock signal, the circuit that has just been described is a fully differential operational amplifier and acts as a buffer between the reference voltage generator Vref and one or more user circuit stages connected to its outputs Vrefp and Vrefm. In particular, the differential output voltage is Vrefp–Vrefm=2*CS/CD* Vref, where CS is the capacity of each of the two sampling capacitors CSp and CSm, and CD is the capacity of each of the two dumping capacitors CDp and CDm. It should be noted that the capacitance of the integration capacitors determines only the time constant of the stabilization phase.

The circuit unit comprising the 2 capacitors $C1p$, $C1m$ and $C2p$, $C2m$ constitutes a feedback circuit that, as already mentioned, has the task of detecting the voltage levels of the amplifier outputs and to keep them constant by acting on a common mode regulating parameter of the amplifier. In short, the unit has the function of maintaining the common mode output voltage constant at the predetermined value Vref.

Given the present trend of reducing the supply voltage of integrated circuits and the ever greater need for limiting both the power consumption and the active area on the semiconductor in which the integrated circuit is formed, the design of an operational differential amplifier of the type just described becomes ever more difficult and critical. In particular, the greatest difficulties derive from the desire to have the highest possible differential voltage (for example: 2V when the supply voltage is 2.5V), a high gain and a broad pass band. When the design constraints implied by these requirements become supplemented by the need for using an externally imposed voltage as reference voltage for the stabilization of the common mode output voltage, for example, to use an accurate and stabilized reference voltage generator common to the entire integrated circuit, the design of the operational amplifier becomes even more difficult. Worse still, once the amplifier has been designed in an optimal manner to satisfy all these requirements, a possible modification of the reference voltage would call for an overhaul of the entire design. With a view to avoiding this further difficulty, the operational amplifier is usually designed without defining a precise value of the reference voltage imposed from outside and shifting the common mode output level by means of a level converter that provides the common mode feedback circuit with a voltage of the right level to modify the common mode output voltage by the amount needed to obtain the desired value.

This expedient, in fact, renders the design of the buffer less difficult and critical, but involves a not by any means negligible waste of integrated circuit area to accommodate the level converter. The converter, moreover, causes extra power consumption and noise.

The present invention therefore sets out to realize fully differential amplifier circuit of the type described above that will overcome the drawbacks associated with the state of the art, i.e. a circuit capable of exactly fixing the common mode output voltage that can be realized without occupying additional integrated circuit area or, at least, occupying only a minimal amount of additional area.

This aim is attained by the circuit defined and characterized in general terms in claim 1 hereinbelow.

The invention will be understood more clearly from the detailed description about to be given of two embodiments thereof, which are to be considered as examples and not limitative in any way, said description making reference to the attached drawings of which:

It is important to precede the description of the invention with some general considerations regarding the design of fully differential amplifiers.

The typical advantages of differential circuits with respect to single-ended circuits are a small offset in direct current operation, a greater signal excursion, greater noise immunity and greater simplicity of design. A substantial part of these advantages is due to the constructional symmetry of the two signal paths, usually referred to as positive and negative. In this connection it should be borne in mind that the advantages associated with the use of switched-capacitor technique for the design of differential circuits include, among others, the greater accuracy with which capacitors can be realized in an integrated circuit as compared with the traditional resistors, which implies a better approximation to the symmetry of the differential circuit. For these reasons, symmetry has become almost a dogma for differential circuit designers.

The present invention goes against this general trend, normally not even called into question, and proposes the introduction of a constructional asymmetry that makes it possible to simplify the design of a fully differential circuit and to obtain both a saving of integrated circuit area and a smaller power consumption of the circuit during operation.

Figure 1:
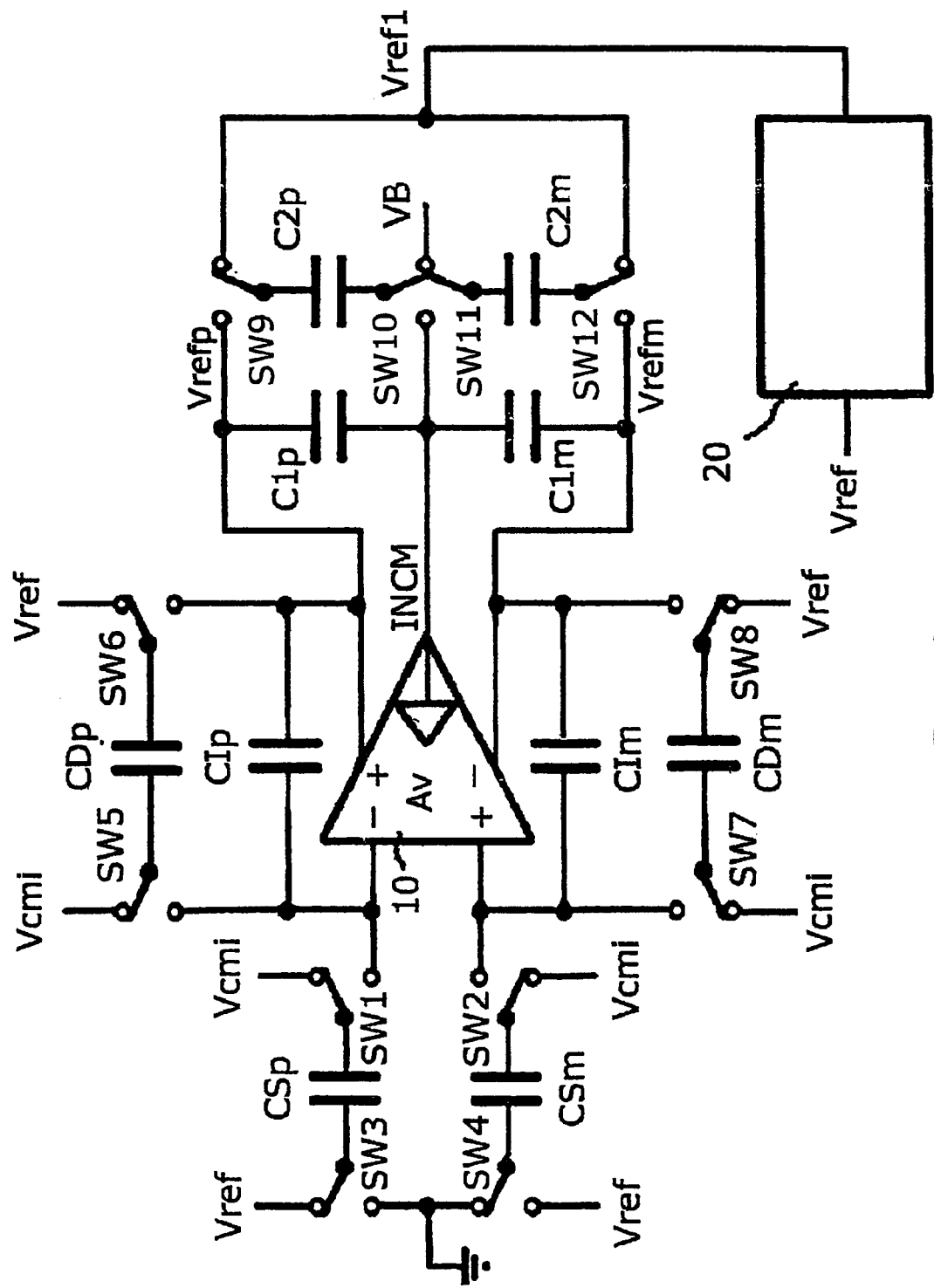
FIG. 1 shows the schematic layout of a known differential amplifier circuit with switched capacitors.
Figure 2:
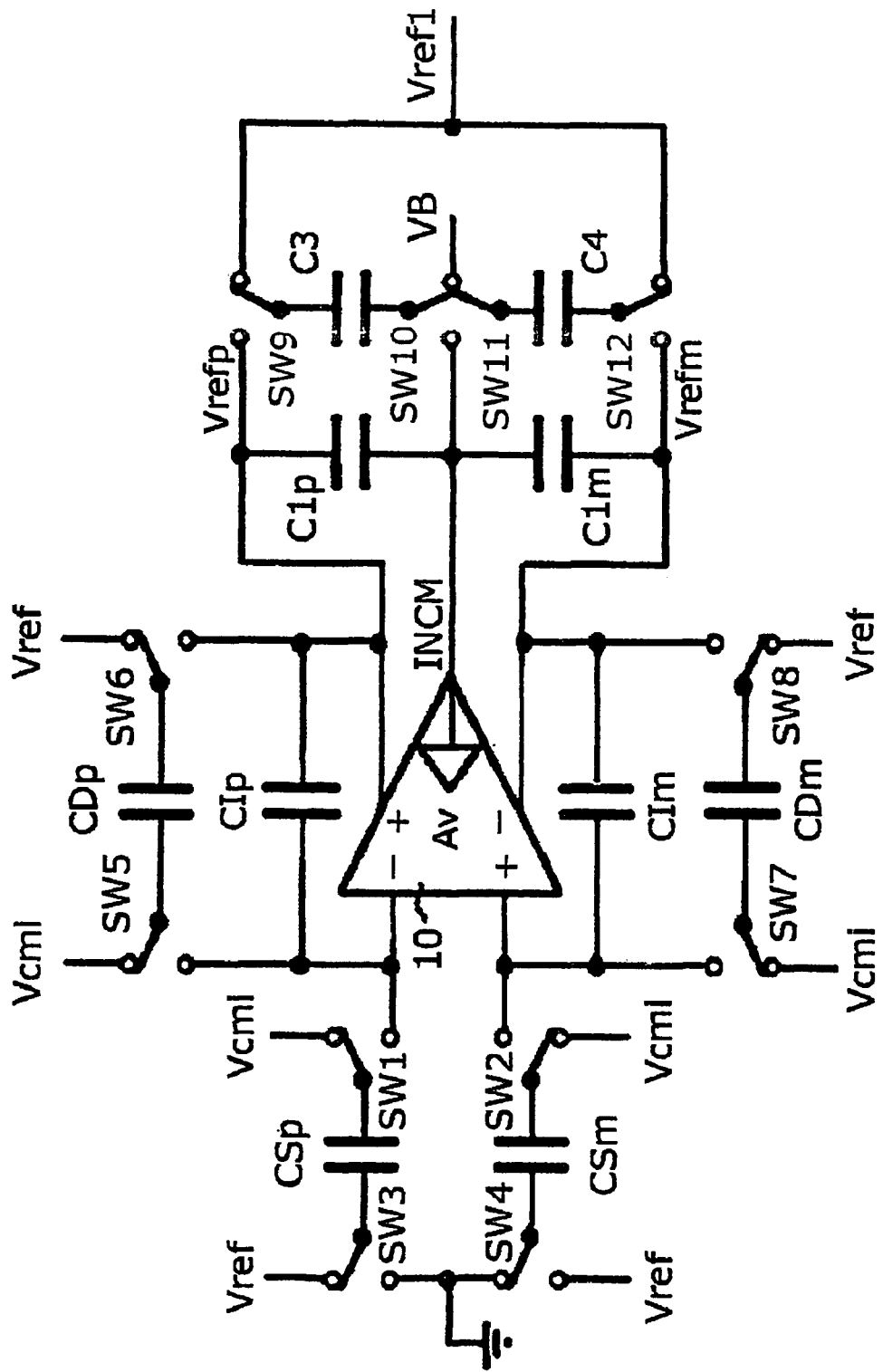
FIG. 2 shows the schematic layout of a differential amplifier circuit with switched capacitors in accordance with a first embodiment of the invention.

The schematic layout of the circuit in accordance with the invention as shown in FIG. 2, where elements equal to those of FIG. 1 are always identified by the same reference numbers, is very similar to the known circuit of FIG. 1. Nevertheless, an important difference is represented by the absence of the level converter 20. Another difference, not brought out by a simple examination of the circuit diagram, is the actual value of the two switched capacitances of the common mode feedback circuit, here indicated by C3 and C4. According to the invention, these two capacitances are generally different from each other. Thanks to their difference, the common mode output voltage, and therefore the levels of the differential output voltages Vrefp and Vrefm, are different from those that would be produced if the two capacitances were identical. In particular, given an interval Vrefp−Vrefm and a reference voltage Vrefl, which could be equal to the reference voltage Vref applied to the amplifier input, the capacitors C3 and C4 can be chosen with capacitances such as to obtain a common mode voltage Vcmn that will generally be different from the applied reference voltage Vrefl. According to the invention, more precisely, the capacitances of C3 and C4 must substantially satisfy the following equality:

Vcmn=Vrefl+[(Vrefp−Vrefm)/2]*(C4−C3)/(C3+C4)

In a practical application, with Vrefp−Vrefm=2V and Vrefl=Vref−1.35V, values of Vcmn comprised between 1.2V and 1.5V have been obtained by appropriately modifying the capacitances C3 and C4. The sole negative effect deriving from this unbalancing that has been noted is that the feedthrough of the feedback circuit has a differential content that gives rise to offset. However, since the switches can be very small and therefore also have very small intrinsic capacitances, the effect thus produced is negligible as compared with the offset of the amplifier circuit as a whole.

Figure 3:
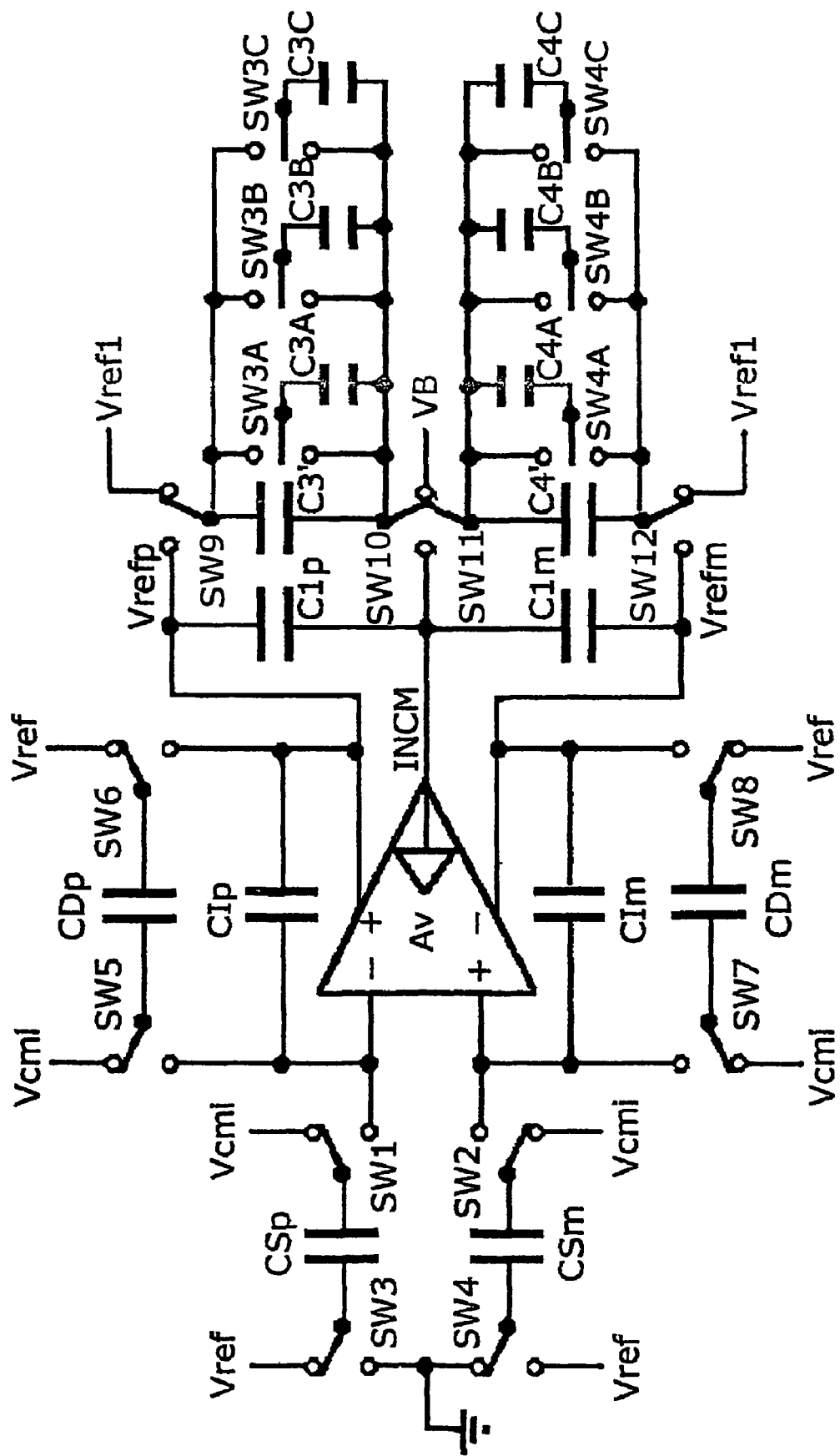
FIG. 3 shows the schematic layout of a differential amplifier circuit with switched capacitors that constitutes a variant of the circuit of FIG. 2.

The invention may be advantageously put into practice also in the case in which the reference voltage Vref1 is not exactly defined at the beginning of the design of the differential amplifier circuit, for example, because not all the components of the circuit system of which it will eventually form part have yet been completely defined. In this case capacitive units of adjustable capacitance may be provided in place of the capacitors C3 and C4. A practical example of this variant of the invention is shown in FIG. 3. As can be seen, each unit comprises a "principal" capacitor, indicated by C3' and C4', and some "secondary" capacitors (three in this particular example, indicated by C3A, C3B, C3C; C4A, C4B and C4C) that may or may not be connected in parallel with their respective principal capacitor by means of, respectively, switches SW3A, SW3B, SW3C; SW4A, SW4B, SW4C, respectively. These switches could be transistors controlled by fuses, a register, an EPROM or other devices, or could be formed by metallic connections capable of being opened by one of the usual methods for calibrating integrated circuits. The use of transistors controlled by a register could be the most convenient solution, because it makes it possible for the capacitive units to be easily regulated also in the phase of adjusting and testing the circuit system that contains the amplifier in accordance with the invention.

In a practical application of the invention in which Vref=1.35V, (Vrefp−Vrefm)=2V, C3'=C4'=450 fF, C3A=

C3B=C3C=C4A=C4B=C4C=50 fF, a common mode voltage Vcmn=1.25V can be obtained by connecting only the capacitors C3A and C3B in parallel with the capacitor C3', so that C3'=550 fF and C4'=450 fF.

It is clear from what has been said above that the aim of the invention is fully attained thanks to the fact that the common mode output voltage can be set with precision by merely regulating the capacitance of the two capacitors and without employing any additional circuit area.

What is claimed is:

1. A fully differential amplifier circuit with switched capacitors, comprising
    a differential amplifier having a first and a second input terminal, a first and a second output terminal, and a common mode regulation terminal; and
    a common mode regulation circuit having a first and a second capacitor connected between the common mode regulation terminal and, respectively, the first and the second output terminal, and first and second capacitive elements with associated controlled switching elements that simultaneously connect the first and the second capacitive elements in parallel with, respectively, the first and the second capacitor and alternately between a biasing voltage terminal and a reference voltage terminal, respectively,
    wherein the first and the second capacitive elements are chosen with capacitances such that a common mode output voltage will substantially satisfy the following equality:

$$Vcmn=Vrefl+[(Vrefp-Vrefm)/2]*(C4-C3)/(C3+C4)$$

where Vcmn is the common mode output voltage,
    Vrefl is a voltage at the reference voltage terminal,
    Vrefp and Vrefm are voltages at, respectively, the first and the second output terminal, and
    C3 and C4 are capacitances of, respectively, the first and the second capacitive elements.

2. A circuit in accordance with claim 1, wherein the first and the second capacitive elements comprise capacitive units of adjustable capacitance.

3. A circuit in accordance with claim 2, wherein each of the capacitive units comprises a multiplicity of capacitors and associated selectively controllable connecting elements to regulate the capacitance of the capacitive units.

4. A circuit in accordance with claim 1, further comprising two sampling capacitors having respective first electrodes that are selectively connected by respective controlled switches to the first and the second input terminals of the amplifier and respective second electrodes that are selectively connected by respective controlled switches to an output of a reference voltage generator or to a common reference terminal.

5. A circuit in accordance with claim 1, further comprising, respectively between the first input terminal and the first output terminal and between the second input terminal and the second output terminal, a first and a second integration capacitor and a first and a second dumping capacitor that are connected in parallel with the first and second integration capacitors by respective controlled switches.

6. A circuit system, comprising:
    a fully differential amplifier circuit that includes:
        a differential amplifier having a first and a second input terminal, a first and a second output terminal, and a common mode regulation terminal; and
        a common mode regulation circuit having a first and a second capacitor connected between the common mode regulation terminal and, respectively, the first and the second output terminal, and first and second capacitive elements with associated controlled switching elements that simultaneously connect the first and the second capacitive elements in parallel with, respectively, the first and the second capacitor and alternately between a biasing voltage terminal and a reference voltage terminal, respectively,
        wherein the first and the second capacitive elements are chosen with capacitances such that a common mode output voltage will substantially satisfy the following equality:

$$Vcmn=Vrefl+[(Vrefp-Vrefm)/2]*(C4-C3)/(C3+C4)$$

where Vcmn is the common mode output voltage,
        Vrefl is a voltage at the reference voltage terminal,
        Vrefp and Vrefm are voltages at, respectively, the first and the second output terminal, and
        C3 and C4 are capacitances of, respectively, the first and the second capacitive elements;
    a generator of a single-ended reference voltage; and
    coupling means between the output of the reference voltage generator and each of the input terminals of the differential amplifier, wherein the reference voltage terminal is connected to an output of the reference voltage generator.

7. A fully differential amplifier circuit with switched capacitors, comprising
    a differential amplifier having first and second output terminals and a common mode regulation terminal;
    a common mode regulation circuit having:
        first and second capacitive elements connected between the common mode regulation terminal and the first and second output terminals, respectively; and
        third and fourth capacitive elements with associated controlled switching elements that, in a first mode, simultaneously connect the third and fourth capacitive elements in parallel with, respectively, the first and second capacitive elements and, in a second mode, connect the third and fourth capacitive elements between a biasing voltage terminal and a reference voltage terminal, respectively, wherein the third capacitive element has a different capacitance than the fourth capacitive element such that a common mode output voltage of the differential amplifier circuit is not equal to a reference voltage at the reference voltage terminal.

8. The amplifier circuit of claim 7, wherein the third and fourth capacitive elements comprise capacitive units of adjustable capacitance.

9. The amplifier circuit of claim 8, wherein each of the capacitive units comprises a plurality of capacitors and associated selectively controllable connecting elements to regulate the capacitances of the capacitive units.

10. The amplifier circuit of claim 7, further comprising two sampling capacitors having respective first electrodes that are selectively connected by respective controlled switches to first and the second input terminals of the differential amplifier and respective second electrodes that are selectively connected by respective controlled switches to an output of a reference voltage generator or to a common reference terminal.

11. The amplifier circuit of claim 7 wherein the differential amplifier includes first and second input terminals, the amplifier circuit further comprising:
    a first integration capacitor connected between the first input terminal and the first output terminal;

a second integration capacitor connected between the second input terminal and the second output terminal;

a first dumping capacitor connected in parallel with the first integration capacitor by first switches; and a second dumping capacitor connected in parallel with the second integration capacitor by second switches.

12. The amplifier circuit of claim 7 wherein the differential amplifier includes first and second input terminals, the amplifier circuit further comprising:

first and second input voltage terminals connected to the first and second input terminals of the differential amplifier, wherein one of the first and second input voltage terminals is connected a reference voltage that is equal to the reference voltage at the reference voltage terminal.

13. A fully differential amplifier circuit, comprising a differential amplifier having first and second output terminals and a common mode regulation terminal;

a common mode regulation circuit having:
   a biasing terminal;
   a voltage reference terminal;
   a first capacitive element connected alternately between the common mode regulation terminal and the first output terminal and between the biasing terminal and the voltage reference terminal; and
   a second capacitive element connected alternately between the common mode regulation terminal and the second output terminal and between the biasing terminal and the voltage reference terminal, wherein the first and the second capacitive elements are chosen with capacitances such that a common mode output voltage of the amplifier circuit will substantially satisfy the following equality:

$$Vcmn = Vrefl + [(Vrefp - Vrefm)/2] * (C2 - C1)/(C1 + C2)$$

where Vcmn is the common mode output voltage,
   Vrefl is a voltage at the reference voltage terminal,
   Vrefp and Vrefm are voltages at, respectively, the first and second output terminals, and
   C1 and C2 are capacitances of, respectively, the first and the second capacitive elements.

14. The amplifier circuit of claim 13, wherein the first and second capacitive elements comprise capacitive units of adjustable capacitance.

15. The amplifier circuit of claim 14, wherein each of the capacitive units comprises a plurality of capacitors and associated selectively controllable connecting elements to regulate the capacitances of the capacitive units.

16. The amplifier circuit of claim 13, further comprising two sampling capacitors having respective first electrodes that are selectively connected by respective controlled switches to first and the second input terminals of the differential amplifier and respective second electrodes that are selectively connected by respective controlled switches to an output of a reference voltage generator or to a common reference terminal.

17. The amplifier circuit of claim 13 wherein the differential amplifier includes first and second input terminals, the amplifier circuit further comprising:

a first integration capacitor connected between the first input terminal and the first output terminal;

a second integration capacitor connected between the second input terminal and the second output terminal;

a first dumping capacitor connected in parallel with the first integration capacitor by first switches; and a second dumping capacitor connected in parallel with the second integration capacitor by second switches.

18. The amplifier circuit of claim 13 wherein the differential amplifier includes first and second input terminals, the amplifier circuit further comprising:

first and second input voltage terminals connected to the first and second input terminals of the differential amplifier, wherein one of the first and second input voltage terminals is connected a reference voltage that is equal to the reference voltage at the reference voltage terminal.

19. The amplifier circuit of claim 13, further comprising:

a first sampling capacitor switchably connected to the first input voltage terminal and to the first input terminal of the differential amplifier; and a second sampling capacitor switchably connected to the second input voltage terminal and to the second input terminal of the differential amplifier.

* * * * *